United States Patent [19]

Boutaud et al.

[11] Patent Number: 5,043,933

[45] Date of Patent: Aug. 27, 1991

[54] INTERPOLATION FILTER OF CASCADED INTEGRATOR-COMB TYPE

[75] Inventors: Frederic Boutaud, Houston, Tex.; Paul Correia; Christian Ponte, both of Antibes, France

[73] Assignee: Texas Instruments Incorporated, Dallas, Tex.

[21] Appl. No.: 427,285

[22] Filed: Oct. 25, 1989

[30] Foreign Application Priority Data

Oct. 26, 1988 [FR] France .................... 88 13986

[51] Int. Cl.⁵ .................................. G06F 15/31
[52] U.S. Cl. ........................ 364/724.1; 364/724.17
[58] Field of Search .................... 364/724.1, 724.17

[56] References Cited

U.S. PATENT DOCUMENTS 4,302,631 11/1981 Shenoi et al. ................. 364/724.1
4,833,717 5/1989 Nakamura et al. .............. 381/50
4,864,526 9/1989 Dyer ............................ 364/724.1

OTHER PUBLICATIONS

Hogenauer, E., "An Economical Class of Digital Filters for Decimation and Interpolation", IEEE Trans. On Acoustics, Speech, and Signal Processing, vol. ASSP-29, #2, pp. 155-162, Apr. 1987.

Chu et al., "Multirate Filter Designs Using Comb Filters", IEEE Trans. on Circuits and Systems, vol. CAS-31, #11, pp. 913-923, Nov. 1984.

Hogenauer, E., "A Class of Digital Filters for Decimation and Interpolation", ICASSP 80 Proceedings, 4/9-4/11/80, pp. 271-274.

Primary Examiner—Dale M. Shaw
Attorney, Agent, or Firm—William E. Hiller; N. Rhys Merrett; Melvin Sharp

[57] ABSTRACT

This interpolative filter comprising N differentiating stages (4A-4N) constituting a section of low sampling frequency and N integrating stages (5A-5N) constituting a section of high sampling frequency is characterized in that is further comprises modulators (7A-7N) which are inserted into the string of integrators and which are intended to eliminate the increasing of the number of bits of the signal at each integration stage, and in that the said integrators are each included in a differentiation loop.

7 Claims, 4 Drawing Sheets

INTERPOLATION FILTER OF CASCADED INTEGRATOR-COMB TYPE

BACKGROUND OF THE INVENTION

1. Field of the Invention

The present invention relates to filters, and is concerned, more particularly, with interpolative filters.

2. Description of the Prior Art

The techniques of interpolation are employed in integrated circuits for the purpose of increasing the sampling frequency of a digital signal before its conversion into an analog signal.

This technique is necessary in order to limit the out-of-band energy constituted by the image frequencies present in the frequency spectrum of the sample signal, and is employed in the majority of signal processing systems.

The interpolation of a digital signal is carried out by low-pass digital filtering associated with an increase in the sampling frequency.

In the current of the art, a simple low-pass filter forms an average of $p+1$ samples, which is represented in the z field by the transfer function:

$$H(z) = 1 + z^{-1} + z^{-2} + \ldots + z^{-p}$$

A well-known construction of such a filter is based on the relation:

$$1 + z^{-1} + z^{-2} + \ldots + z^{-p} = (1 - z^{-p-1})/(1 - z^{-1}).$$

and utilizes a line of $p+1$ delays, a differentiator and an integrator.

This same construction has been adapted and generalized to interpolative filters in a structure, referred to as a cascaded integrator-comb CIC structure, composed of a cascade of differentiators and of a cascade of integrators. Between the two cascades there is interposed a change of the sampling frequency. The structure of this class of interpolative digital filters has been described in a publication by B. HOGENAUER, (IEEE, ICAASP proceedings 1980, p. 271).

A CIC filter of this type is composed of N differentiating stages connected in series, followed by an identical number N of integrating stages.

The number N of stages determines the order of the filter, and thus the attenuation of the image spectra.

The change of sampling frequency is carried out between the output of the set of differentiators and the input of the set of integrators.

The frequency change ratio is designated k. Such a known filter structure exhibits two major disadvantages:

First of all, it is necessary to initialize the integrators which are never reupdated and indefinitely maintain a shift equal to the initial value.

Then, the number of bits in the integrators increases at each stage as a function of the ratio k between the output and input sampling frequencies of the filter. This may lead to register widths which are far too large, especially if the order of the filter and the interpolation ratio are high.

SUMMARY OF THE INVENTION

The purpose of the invention is to remedy the disadvantages of the known interpolative filters set forth hereinabove by creating an interpolative filter which is simpler to construct with the aid of a logical, homogeneous and repetitive structure, and which avoids increasing the number of bits of its output signal as compared with its input signal.

It therefore has an interpolative filter comprising N differentiating stages constituting a section of low sampling frequency and N integrating stages constituting a section of high sampling frequency, characterized in that each integrating stage is associated with a differentiating stage, a differentiating stage of rank i being connected to an integrating stage of rank $N+1-i$, with $1 \leq i \leq N$, and in that one output of each integrator is connected, at the timing of the low frequency, to the subtraction input of the corresponding differentiator.

The invention will be better understood with the aid of the description which will follow, which is given purely by way of example and made with reference to the accompanying drawings.

DESCRIPTION OF THE PREFERRED EMBODIMENTS

The interpolative filter of known type represented in FIG. 1 comprises, as already indicated hereinabove, N differentiating stages 1A to 1N disposed in series, N integrating stages 2A to 2N likewise disposed in series, a memory 3 connected to the output of the differentiator 1N and means 3A for changing the sampling frequency which is interposed between the output of the memory 3 and the input of the set of integrators.

The operation of this type of known filter will not be described in detail.

However, it will be stated that the main advantages with regard to the construction of the filter are that it requires neither a multiplier nor elements for the storage of the coefficients of the filter, and comprises a limited number of registers for the storage of the samples.

However, as indicated hereinabove, the integrators of such a filter are never reupdated, so that they must be initialized.

On the other hand, the number of bits in the integrators increases at each stage as a function of the ratio k between the output and input sampling frequencies of the filter; this may lead to register widths which are far too large, especially if the order of the filter and the interpolation ratio are high.

Figure 2:
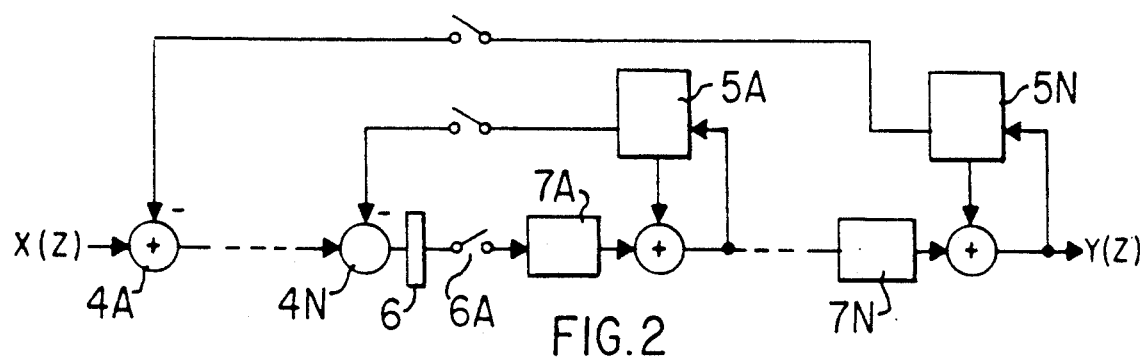
FIG. 2 is a block diagram of an interpolative filter according to the invention.

In order to remedy these disadvantages, and to permit a simpler construction with an integrated, homogeneous and repetitive logical structure, it is proposed to construct an interpolative filter, the diagram of which is represented in FIG. 2.

Figure 1:
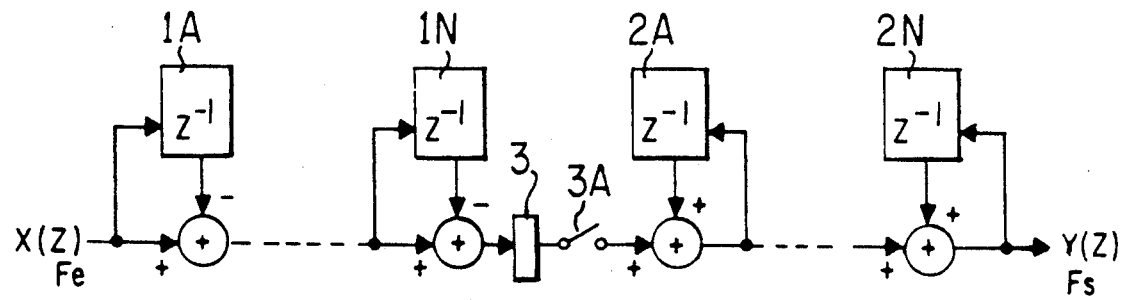
FIG. 1 is a block diagram of the conventional structure of an interpolative filter of the CIC type comprising a succession of differentiators and a succession of integrators.

The filter according to the invention comprises, just like the known filter of FIG. 1, a section of low sampling frequency Fe formed of N differentiating stages 4A to 4N, a section of high sampling frequency Fs formed of N integrating stages 5A to 5N, a memory 6 at the output of the last differentiator, and means 6A for changing the frequency.

The filter according to the invention further comprises modulators 7A to 7N inserted in the string of integrators and which are intended to reduce the number of bits in the integrators. In this arrangement, the values contained in the integrators are used to carry out the differentiation at the low sampling frequency.

Any type of modulator permitting a reduction in the number of bits while maintaining the signal-to-noise ratio may be used.

Figure 3:
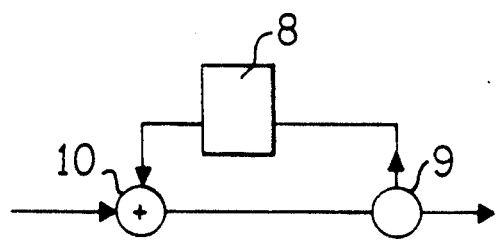
FIG. 3 is a diagram of an embodiment of a modulator included in the construction of the filter of FIG. 2.

FIG. 3 represents a modulator of order 1 which may be included in the construction of the filter of FIG. 2.

In this type of modulator, the reduction of the number of bits is carried out by a simple truncation The most significant bits are retained in order to form the value of the output sample and the least significant bits constituting the encoding error are recombined with the following input sample.

This modulator is essentially constituted by a register 8, the input of which is connected to an output of a switch 9 and the output of which is connected to an input of a summer 10.

Another input of the summer 10 constitutes the input of the modulator, while its output is connected to the input of the switch 9.

Figure 4:
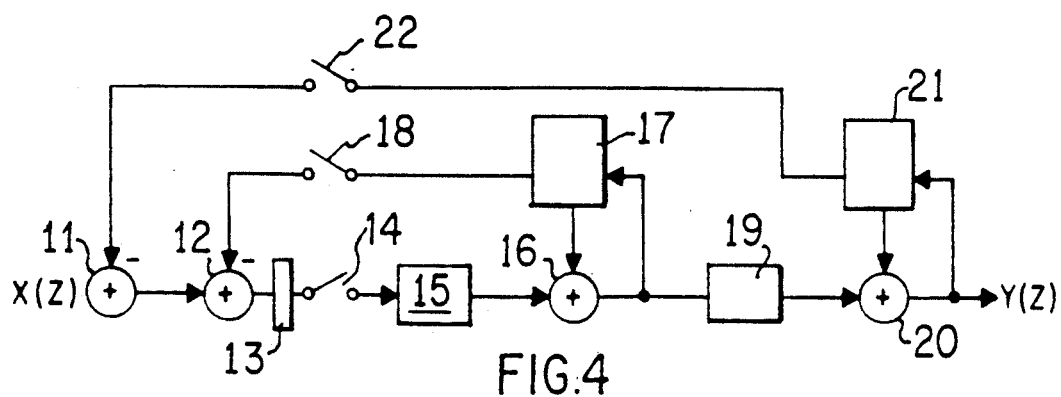
FIG. 4 is a diagram representing an embodiment of a two-stage 64 kHz 512 kHz interpolation filter.

FIG. 4 shows a specific embodiment of a two-stage interpolation filter. The function of this filter is to increase the sampling frequency in a ratio 8 in order to cause it to change, in the present example, from 64 kHz to 512 kHz, while filtering the image frequencies about 64 kHz and about its multiples.

The input samples are encoded on 16 bits. The objective is to construct a compact and homogeneous device, with a 16-bit organization identical to that of the input samples.

The increase in the number of bits in the integrators is 3 bits ($8=2^3$).

In this construction, use is made of modulators of order 1 which, by modulating 3 bits, reduce to 13 the number of bits at the input of the integrators.

Thus, the maximum number of bits along the entire interpolation string is maintained and limited to 16.

The interpolation filter of FIG. 4 comprises an input to which there is applied the signal $X(z)$, connected via a first differentiator 11 and a second differentiator 12 to the input of a storage register 13.

The output of the register 13 is connected, via a frequency changing component 14, to the input of a first modulator 15.

The output of the modulator 15 is connected to an input terminal of a summer 16, the other input terminal of which is connected to an output of a register 17 contained within a memory and providing the function of integrator.

Another output of the register 17 is connected, via a frequency changing component 18, to a terminal of the second differentiator 12.

The output of the summer 16 is connected to the input of a second modulator 19, the output of which is connected to an input terminal of a summer 20. The output of the summer 20, which constitutes the output of the circuit, is connected to an integrator 21 similar to the integrator 17.

An output of the integrator 21 is connected to another input of the summer 20, while its other output is connected, via a frequency changing component 22, to an input of the first differentiator 11.

Figure 5:
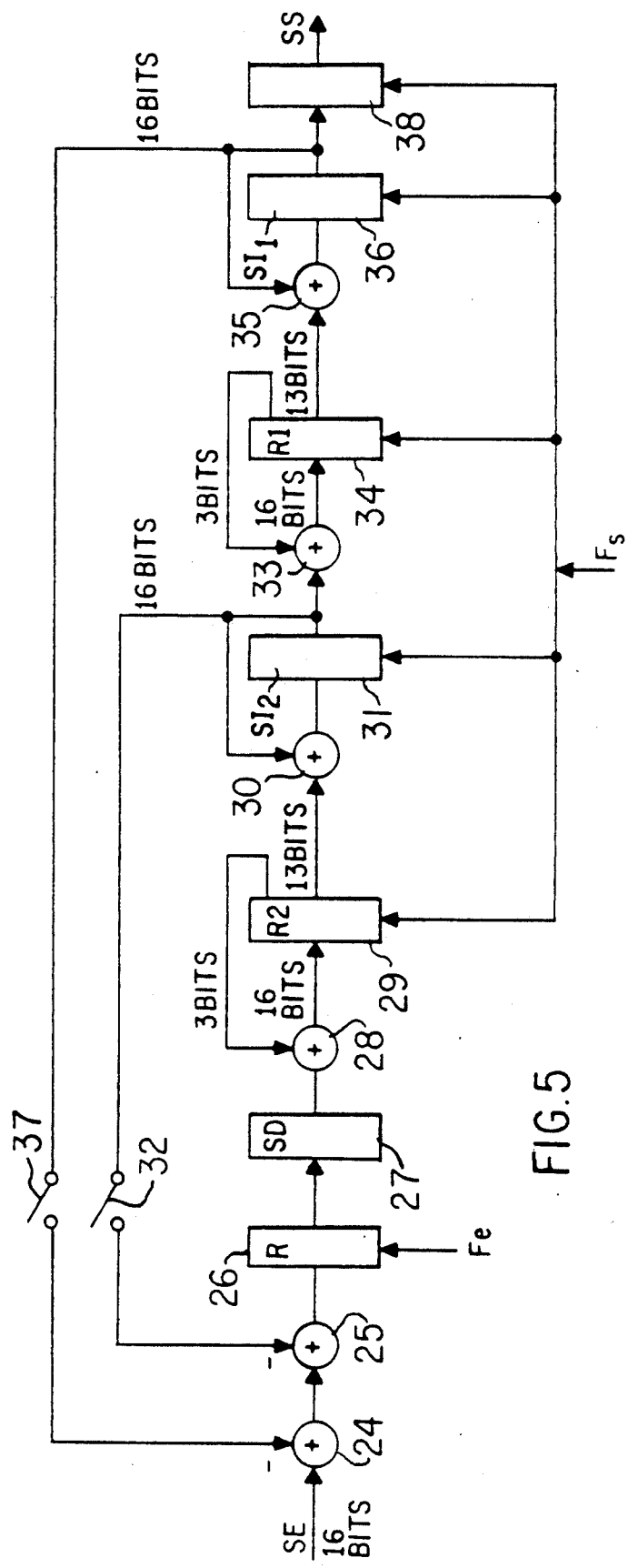
FIG. 5 is a more detailed diagram of an embodiment of an interpolative filter according to the invention.

FIG. 5 shows a more detailed diagram of an embodiment of interpolative filter according to the invention.

The input SE of the circuit of FIG. 5 is connected to a first differentiator 24 which in turn is connected to a second differentiator, 25.

To the output of the second differentiator 25 there is connected a register 26 for the storage of the differentiated value originating from the differentiator 25.

The register 26 is controlled at the low frequency Fe applied to its control input.

The output of the register 26 is connected to the input of a storage circuit 27, the, output of which is connected to a summer 28 which sums the content of the circuit 27 with three bits resulting from the modulation of the output signal of the summer 28 by a register 29 forming a modulator.

The output of the register 29 is connected to a summer 30 associated with a first integrator 31, the output of which is, on the one hand, likewise connected to the summer 30 and, on the other hand, connected to the second differentiator 25 via a switch 32 controlled at the low frequency Fe.

The output of the first integrator is furthermore connected to a summer 33, the output of which is connected to a second register 34 forming a modulator, which is intended to apply to the summer 33 the three least significant bits of its output signal The output of the register 34 is connected to the input of a summer 35 associated with a second integrator 36, the output of which is, on the one hand, looped back to an input of the summer 35 and, on the other hand, connected to the first differentiator 24 via a switch 37 controlled at the low frequency Fe. The output of the integrator 36 is connected to an output register 38.

The registers 29, 34 and the integrators 31, 36 are controlled at the high frequency Fs.

Figure 6:
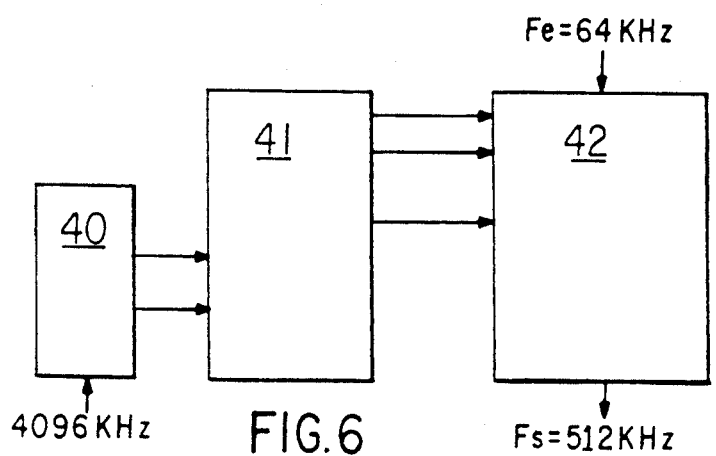
FIG. 6 is a block diagram of the circuit of the interpolative filter according to the invention.

FIG. 6 represents the block diagram of the interpolative filter according to the invention.

It comprises a 6-bit counter 40, connected to a condition decoder 41, the outputs of which are connected to the control inputs of a computation unit 42 which receives, on its input, the input signal at low frequency equal, in the present example, to 64 kHz and which delivers, at its output, a signal at high frequency equal, in the present example, to 512 kHz.

The computation unit 42 will now be described with reference to FIG. 7.

It comprises two stacks A and B of three registers each.

The registers A1, A2, A3 are controlled in write respectively by the signals Wa1, Wa2, Wa3 and in read by the signals ra1, ra2, ra3 emanating from a generator 43 controlled by the decoder 41 of FIG. 6.

The registers B1, B2 and B3 of the stack B are controlled in a similar manner by the signals Wb1, Wb2 and Wb3 and rb1, rb2, rb3 emanating from a generator 44 controlled by the decoder 41.

The computation unit further comprises two multiplexers 45 and 46 which are associated respectively with the register stacks A and B.

Under the action of the control signals muxa1 and muxa2, the multiplexer 45 performs the functions "A", "complement of A" or "zero".

Under the action of the signals muxb1, muxb2, muxb3, the multiplexer 46 performs the functions "B", "shift to the right by three bits of B" or "only the three least significant bits of B".

To the outputs of the multiplexers 45 and 46 there is connected a 16-bit adder 47, the output of which is connected to an output register 48.

The output of the adder 47 is furthermore looped back to a multiplexer connected to the input of the stack of registers B and which receives the input signal, and also looped back to the input of the stack of registers A.

The multiplexer 49 permits selection between the input data item and the data item present on the connecting bus between the output of the adder 47 and the inputs of the stacks of registers A and B.

Figure 9:
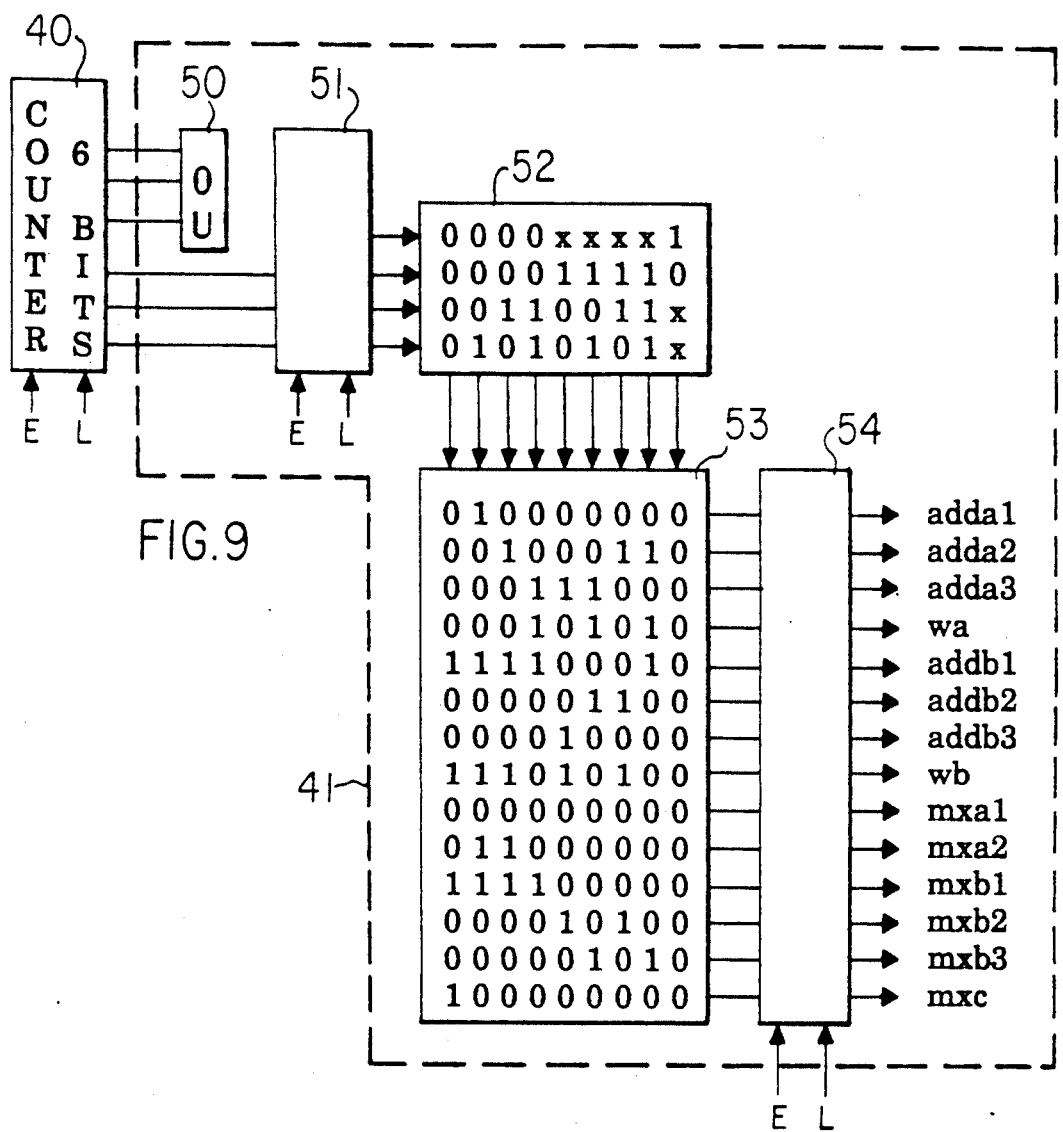
FIG. 9 is a more detailed block diagram of the condition decoder included in the construction of the filter according to the invention.

The diagram represented in FIG. 9 illustrates in a more detailed manner the condition decoder 41 which forms a part of the interpolative filter of FIG. 6.

The 6-bit counter 40 is connected to the input of the decoder.

The condition decoder 41 per se is bounded by the rectangle shown in dot and dash lines.

It comprises an OR circuit 50 having three inputs which are connected to three outputs of the counter 40.

The output of the OR circuit 50 is connected to an input of a register 51, three other inputs of which are connected to three corresponding outputs of the counter 40.

Figure 7:
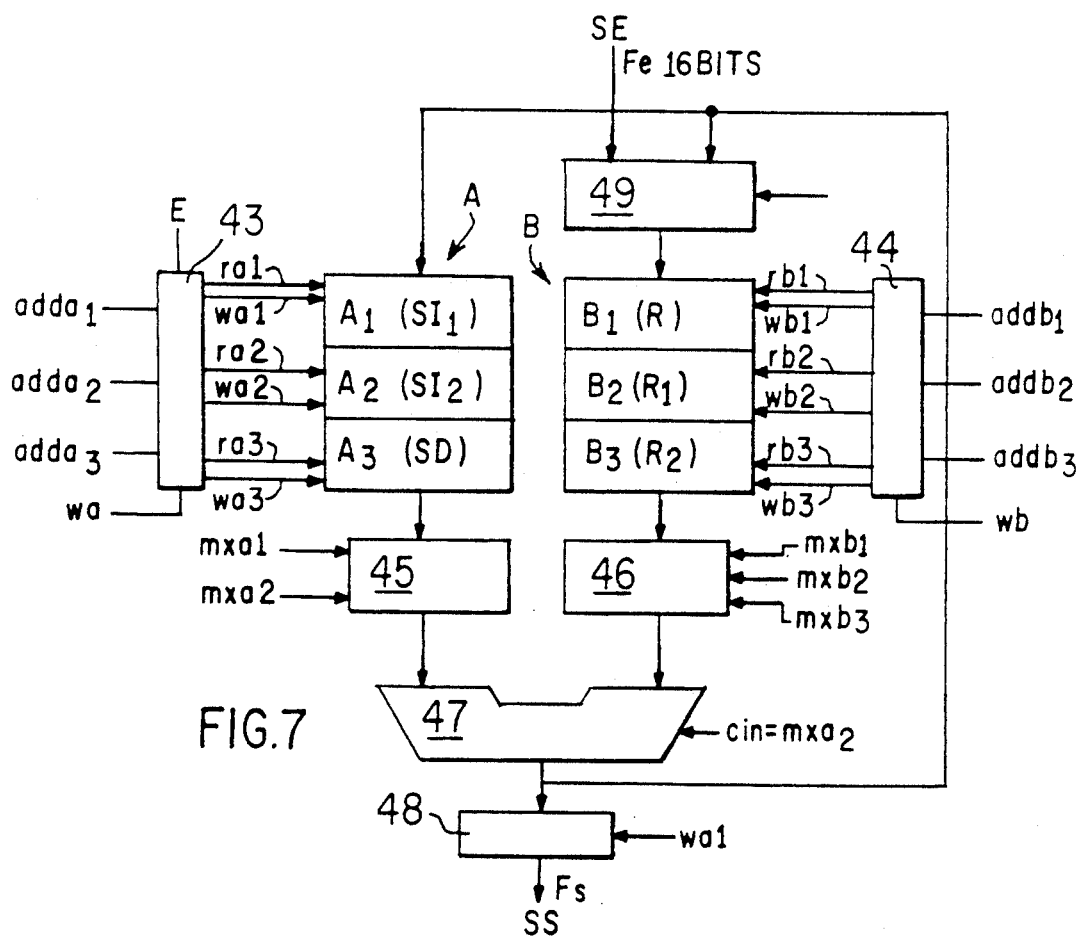
FIG. 7 is a diagram of the computation unit of the filter of FIG. 6.

The outputs of the register 51 are connected to the inputs of a buffer circuit 52, the outputs of which are connected to the inputs of a condition generator circuit 53 associated with an output register 54 on which there appear the condition signals intended for the various components of the computation unit of FIG. 7.

The operation of the interpolative filter according to the invention will be described with reference to FIGS. 5 to 9.

The input signal SE composed of 16 bits undergoes two successive differentiations in the differentiators 24 and 25 and the differentiated values are stored in the register 26 controlled at the low frequency Fe.

The register 26 of content R is represented in FIG. 7 by the register $B_1$ of the stack B.

It is controlled by the signals $rb_1$ and $wb_1$ created by the generator 44 (FIG. 7).

The output signals of the register 26 are transferred to the memory 27 which is represented in material form by the register $A_3$ of the stack A (FIG. 7), of content SD.

They then undergo a first modulation in the modulator constituted by the register 29 of content R2 and the adder 28.

At the output of the register 29 materially represented by the register $B_3$ of the stack B, and controlled by the signals $rb_3$ and $wb_3$, the 13 most significant bits of the signal are transmitted to the following stage, while the three least significant bits are applied to the adder 28.

The 13 most significant output bits of the register 29 are applied to the integrator formed by the register 31 materially represented by the register $A_2$ of FIG. 7 and the adder 30 which likewise receives the said 16 output bits of the register 31.

The output signal of the register 31 is applied to the differentiator 25 via the switch 32 which is activated at the low frequency Fe.

The 16-bit output signal of the register 31 is applied to the modulator formed by the adder 33 and by the register 34 which is materially represented in FIG. 7 by the register $B_2$ of content R1 of the stack B, which register is controlled by the signals $rb_2$, $wb_2$.

The three least significant bits of the output signal of the register 34 are applied to the adder 33 which receives the output signal of the register 31.

Thus, the output signal of the modulator 34 is always a signal formed from the 13 most significant bits.

These 13 bits are applied to the integrator formed by the adder 35 and by the register 36 materially represented in FIG. 7 by the register $A_1$ of the stack of registers A, which register is controlled by the signals $ra_1$, $wa_1$ and of content SI1.

In the adder 35, the 13 bits of the output signal of the register 34 are combined with the 16 output bits of the register 36.

The output signal of the register 36 is applied to the differentiator 24 via the switch 37 which is controlled at the low frequency Fe.

It is, moreover, applied to the output register 38.

The registers 29, 31, 34, 36 and 38 are controlled at the high frequency Fs.

The contents of the registers 27, 31, 36 are processed by the multiplexer 45, while those of the registers 26, 29, 34 are processed by the multiplexer 46.

The multiplexer 45 receives on its input the signals: a15 a14 a13 a12 a11 a10 a09 a08 a07 a06 a05 a04 a03 a02 a01 a0.

It delivers at its output the following signals: with mxa 1=0, mxa 2=0: $\overline{a15}\ \overline{a14}\ \overline{a13}\ \overline{a12}$ a11 $\overline{a10}$ a09 a08 a07 a06 a05 a04 a03 a02 $\overline{a01}$ a0. with mxa 1=1, mxa 2=x: 0 0 0 0 0 0 0 0 0 0 0 0 0 0 0 0

The multiplexer 46 receives at its inputs the signals: b15 b14 b13 b12 b11 b10 b09 b08 b07 b06 b05 b04 b03 b02 b01 b0.

It delivers at its output the following signals with mxb 1=1: b15 b14 b13 b12 b11 b10 b09 b08 b07 b06 b05 b04 b03 b02 b01 b0. with mxb 2=1: 0 0 0 0 0 0 0 0 0 0 0 0 0 b02 b01 b0 with mxb 3=1: 0 0 0 b15 b14 b13 b12 b11 b10 b09 b08 b07 b06 b05 b04 b03.

The multiplexer 49 is controlled as follows: if its control signal mxc=0, its input is connected to the bus forming a connection with the output register 48.

If mxc=1, its input is connected to the input of the device.

The 16-bit adder 47 provides the various combinations of output signals from the multiplexers 45 and 46 in accordance with the description given with reference to FIG. 5, while providing the functions of the differentiators 24, 25 and of the adders 28, 30, 33, 35 under the control of the signals which are applied to it by the condition decoder 41.

The signal at the frequency Fs appears at the output of the register 48. This signal is filtered and exhibits 16 bits, just like the input signal.

The generation of the read and write signals is provided by the circuits 43 and 44 on the basis of the addresses delivered by the condition decoder 41, of the signal Wa and of the clock signal M.

The read is selected directly by the address signal (ra1=adda1), while the write signal is the address signal validated by the write command and by the write clock E applied to the circuit 43.

The computation sequence is broken down into eight cycles distributed in four cycles executed at a repetition frequency of 64 kHz and four cycles executed at a repetition frequency of 512 kHz.

These cycles are the following:

at 64 kHz:

Cycle $L_1$: Loading of the register $B_1$ of the stack of registers B of the computation unit (register 26 of FIG. 5) with the sample of the input signal SE.

Cycle $L_2$: $R = R - SI1$ is created, corresponding to the first differentiation of the signal at 64 kHz.

Cycle $L_3$: $R = R - SI2$ is created, corresponding to the second differentiation of the signal at 64 kHz.

Cycle $L_4$: $SD = R$ corresponding to the transfer of the differentiated signal.

at 512 kHz:

Cycle $C_1$: there are created $R2 = SD + 3$ least significant bits of R2 corresponding to a modulation of three least significant bits of the content SD of the memory 27 and to the storage of the result in the register B3 (register 29 of FIG. 5).

Cycle $C_2$: there is executed $SI2 = R$ shift to the left of 3 bits of $R2 + SI2$; the 13 most significant bits of R2 are integrated in SI2.

Cycle $C_3$: there are created $R1 = SI2 + 3$ least significant bits of R1 corresponding to a modulation of the three least significant bits of SI2, permitting a reduction to 13 in the number of bits at the input of the integrator 36 materially represented by the register A1 of the stack A in FIG. 7.

Cycle $C_4$: there is executed $SI1 = R$ shift to the left of 3 bits of $R1 + SI1$. The content of the output register 48 (FIG. 7) = SI1.

The result is loaded into the output register 48 and forms the output sample at 512 kHz.

The system operates with a 4096 kHz clock. The 64 machine cycles contained in a period of the signal at 64 kHz are addressed by the 6-bit counter 40 of the circuit of FIG. 6.

The operation performed at each cycle is selected by the condition decoder 41 represented in a more detailed manner in FIG. 9.

The first four cycles are reserved for the execution of the operations at 64 kHz. These are the cycles $L_1$, $L_2$, $L_3$, $L_4$.

The operations at 512 kHz are executed by groups of four every eight cycles.

Thus, of the 64 machine cycles which are available, 38 cycles are used, the other 26 cycles not giving rise to any other execution.

For the cycle $L_1$:

The count of the counter 40 is 000 000.

The multiplexer 49 is positioned on the input of the signal SE by the signal mxc = 1.

The input signal SE is loaded into the write address register B1 by the signals add $b_1 = 1$ and wb = 1 which are delivered by the decoder 41 and the circuit 44.

For the cycle $L_2$:

The counter 40 is at 000 0001.

For the cycle $L_3$:

The counter 40 is at 000 010.

For the cycle $L_4$:

The counter 40 is at 000 011.

For the cycle $C_1$:

The counter is at XXX 100.

For the cycle $C_2$:

The counter is at XXX 101.

For the cycle $C_3$:

The counter is at XXX 110.

For the cycle $C_4$:

The counter is at XXX 111.

Figure 8:
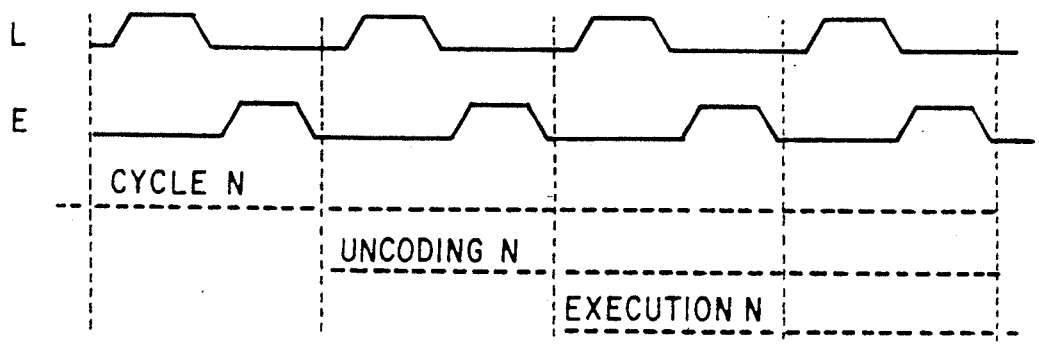
FIG. 8 is a diagram showing an operating cycle of the computation unit of FIG. 7.

The inactive cycles NOP correspond to the following counts of the counter: 0010XX, 0100XX, 0110XX, 1000XX, 1010XX, 1100XX, 1110XX As is seen in the diagram of FIG. 8, an operating cycle of the computation unit is composed of two phases, a read phase L and a write phase E. On a read phase L, the control signals are positioned and the data are read in the address registers. During the write phase, the result of the computation is barred in the write-selected register.

We claim:

1. An interpolative filter comprising:

input means for receiving an input signal to be sampled;

N differentiating stages respectively including a differentiator having an addition input and a subtraction input and defining a first filtering section of low sampling frequency;

said input means being connected to the differentiator of the first of said N differentiating stages at the addition input thereof;

N integrating stages respectively including an integrator and defining a second filtering section of high sampling frequency;

each of said integrating stages being operably connected to a corresponding differentiating stage in accordance with the relationship where a differentiating stage of rank i is connected to an integrating stage of rank $N + 1 - i$, with $1 \leq i \leq N$; and the integrator of each integrating stage having its output selectively connected to the differentiator of the corresponding differentiating stage at the subtraction input thereof in response to signal sampling at the low sampling frequency.

2. An interpolative filter as set forth in claim 1, further including a modulator corresponding to each of said integrating stages, for eliminating an increase in the number of bits of the signal being filtered at each integrating stage, each of said modulators being disposed at the input side of the integrator of the corresponding integrating stage; and a differentiation loop in which a respective integrator is disposed connecting each of said integrating stages to the subtraction input of a respective differentiator of a corresponding differentiating stage.

3. An interpolative filter as set forth in claim 2, wherein each of said modulators comprises:

a bit storage register, a switching device, and a summer having first and second inputs and an output;

said bit storage register having an input connected to the output of said switching device for sampling a predetermined number of lease significant bits of the signal during filtering and having an output connected to the second input of said summer; and the first input of said summer being the input of said modulator and the output of said summer being connected to the input of said switching device.

4. An interpolative filter as set forth in claim 2, wherein each of said integrators of said integrating stages comprises:

a bit storage register, and a summer having first and second inputs;

each modulator corresponding to a respective integrating stage having an output connected to the first input of said summer forming part of the integrator to which the modulator corresponds;

said bit storage register of the respective integrator having an output connected to the second input of the summer of said integrator, the output of said register being further connectable to the subtraction input of the differentiator of the corresponding differentiating stage; and switching means operable between open and closed positions and interposed in the connection between the output of said bit storage register of said integrator and the subtraction input of said differentiator of the corresponding differentiating stage, said switching means controlled at the low sampling frequency so as to be placed in its closed position to connect said bit storage register of said integrator to the subtraction input of the differentiator of the corresponding differentiating stage.

5. An interpolative filter comprising:

a computation unit having an input for receiving an input signal to be sampled at a low sampling frequency and having an output for providing an output signal at a high sampling frequency;

said computation unit having electronic signal processing means for providing the functions of:

differentiators having addition and subtraction inputs and respectively included in N differentiating stages defining a first filtering section of low sampling frequency, integrators respectively included in N integrating stages defining a second filtering section of high sampling frequency, and modulators corresponding to each of the integrating stages for eliminating the increase in the number of bits of the signal being filtered at each integrating stage;

a counter for providing a count output for each of a plurality of different counts in a timed count sequence;

condition decoding means for controlling the operation of said electronic signal processing means of said computation unit in performing interpolative filtering, said condition decoding means having an input connected to the output of said counter and generating control signals at its output in response to respective counts as received from said counter; and said computation unit being connected to the output of said condition decoding means for receiving the control signals generated by said condition decoding means to operate said electronic signal processing means such that the functionally provided integrating stages are operably connected to respective differentiating stages in accordance with a relationship where a differentiating stage of rank i is connected to an integrating stage of rank $N+1-i$, with $1 \leq i \leq N$ and the integrator of each integrating stage has its output selectively connected to the differentiator of the corresponding differentiating stage at the subtraction input thereof in response to signal sampling at the low sampling frequency.

6. An interpolative filter as set forth in claim 5, wherein said condition decoding means comprises:

a logic OR gate circuit, a bit storage register, a buffer circuit, a condition generator circuit, and an output register;

said logic OR gate circuit having its inputs connected to corresponding outputs of said counter and providing a logic OR output connected to one input of said bit storage register;

said bit storage register having other inputs directly connected to outputs of said counter;

said bit storage register having outputs connected to the inputs of said buffer circuit;

the outputs of said buffer circuit being connected to the inputs of said condition generator circuit; and the outputs of said condition generator circuit being connected to said output register to produce outputs therefrom as condition control signals delivered to said computation unit.

7. An interpolative filter as set forth in claim 5, wherein the electronic signal processing means of said computation unit comprises:

a first plurality of registers arranged in a first register stack;

a second plurality of registers arranged in a second register stack;

registers included in said first register stack representing the integrators included in the integrating stages;

registers included in said second register stack representing the modulators corresponding to each of said integrating stages;

means for generating read and write control signals respectively connected to the inputs of each of said first and second register stacks and being responsive to control signals provided as outputs from said condition decoding means;

first and second multiplexers respectively connected to the outputs of said first and second register stacks;

an adder connected to the outputs of said first and second multiplexers and providing the functions of the differentiators of said differentiating stages, of summers of the modulators, and of summers of the integrators of the integrating stages in response to control signals provided by said condition decoding means;

an output register connected to the output of said adder; and a third multiplexer connected between said adder and said output register and to the input of said computation unit for selectively accepting an input sample of said input signal at the low sampling frequency or the output from said adder for input to said first and second register stacks.

* * * * *